US008960627B2

(12) United States Patent
Atallah et al.

(10) Patent No.: US 8,960,627 B2
(45) Date of Patent: Feb. 24, 2015

(54) CHASSIS, BASE, EXTENSION AND CURVED TRACK

(75) Inventors: Jean G. Atallah, Fremont, CA (US); John William Pennington, Jr., Mountain View, CA (US); John J. Briden, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/640,626

(22) PCT Filed: Apr. 27, 2010

(86) PCT No.: PCT/US2010/032626
§ 371 (c)(1),
(2), (4) Date: Oct. 11, 2012

(87) PCT Pub. No.: WO2011/136762
PCT Pub. Date: Nov. 3, 2011

(65) Prior Publication Data
US 2013/0026326 A1  Jan. 31, 2013

(51) Int. Cl.
*F16M 13/00* (2006.01)
*H05K 5/02* (2006.01)
*F16M 11/04* (2006.01)
*F16M 11/10* (2006.01)
(Continued)

(52) U.S. Cl.
CPC ............ *H05K 5/0234* (2013.01); *F16M 11/04* (2013.01); *F16M 11/10* (2013.01); *F16M 11/24* (2013.01); *G06F 1/1601* (2013.01); *F16M 2200/024* (2013.01); *F16M 2200/08* (2013.01); *Y10S 248/921* (2013.01); *Y10S 248/923* (2013.01)

USPC ........ 248/371; 248/921; 248/923; 248/299.1; 361/679.02

(58) Field of Classification Search
CPC .............. G06F 1/16; H05K 7/14; H05K 7/16; F16M 11/18; F16M 1/06; F16M 13/00; F16M 2200/08; Y10S 248/923; Y10S 248/921
USPC .............. 248/371, 372.1, 394, 395, 398, 429, 248/430, 917, 299.1, 292.12, 292.13, 125.8, 248/91, 346.06, 397, 919, 923; 361/679.02, 361/679.61, 681, 682
See application file for complete search history.

(56) References Cited

U.S. PATENT DOCUMENTS 4,295,624 A * 10/1981 Granada ........................ 248/456
4,669,694 A    6/1987 Malick
(Continued)

FOREIGN PATENT DOCUMENTS

CN    1670867 A    9/2005
CN  101079329 A   11/2007
(Continued)

OTHER PUBLICATIONS

International Search Report and Written Opinion received in PCT Application No. PCT/US2010/032626, mailed Jan. 14, 2011, pp. 9.
(Continued)

*Primary Examiner* — Tan Le
(74) *Attorney, Agent, or Firm* — Hewlett-Packard Patent Department; Reed Hablinski

(57) ABSTRACT

A curved track can be attached to a chassis. An extension can be attached to a base. The chassis can be attached to the base. The extension can be in contact with the curved track.

19 Claims, 5 Drawing Sheets

(51) Int. Cl.
*F16M 11/24* (2006.01)
*G06F 1/16* (2006.01)

(56) References Cited

U.S. PATENT DOCUMENTS

| | | | |
|---|---|---|---|
| 5,520,361 A * | 5/1996 | Lee | 248/398 |
| 5,537,127 A * | 7/1996 | Jingu | 345/1.3 |
| 5,835,557 A * | 11/1998 | Malmstrom | 378/197 |
| 6,007,038 A * | 12/1999 | Han | 248/371 |
| 6,227,518 B1 * | 5/2001 | Sun | 248/371 |
| 6,288,891 B1 | 9/2001 | Hasegawa et al. | |
| 6,354,552 B1 | 3/2002 | Chiu | |
| 6,766,994 B2 * | 7/2004 | Serbinski et al. | 248/371 |
| 6,994,306 B1 * | 2/2006 | Sweere et al. | 248/295.11 |
| 7,068,497 B2 | 6/2006 | Chu | |
| 7,147,191 B2 | 12/2006 | Ichikawa et al. | |
| 7,417,695 B2 | 8/2008 | Cheng | |
| 7,878,476 B2 * | 2/2011 | Carson et al. | 248/429 |
| 8,087,629 B2 * | 1/2012 | Gotovac | 248/299.1 |
| 8,505,470 B1 * | 8/2013 | Lira | 108/138 |
| 2003/0189155 A1 | 10/2003 | Serbinski et al. | |
| 2007/0145203 A1 | 6/2007 | Takada et al. | |
| 2011/0155869 A1 * | 6/2011 | Chen | 248/125.8 |

FOREIGN PATENT DOCUMENTS

| | | |
|---|---|---|
| JP | 63-104125 A | 5/1988 |
| JP | 2000-200048 | 7/2000 |
| JP | 2000-259085 | 9/2000 |
| JP | 2001-092364 A | 4/2001 |
| JP | 2007-102247 A | 4/2007 |
| KR | 10-2007-0105819 A | 10/2007 |
| TW | 200939936 | 9/2009 |

OTHER PUBLICATIONS

Office Action, CN Application No. 201080066456.8, Date: Oct. 28, 2014, pp. 1-7.

Office Action, JP Application No. 2013-507926, Date: Oct. 29, 2014, pp. 1-3.

* cited by examiner

CHASSIS, BASE, EXTENSION AND CURVED TRACK

BACKGROUND

A display can be supported by a base attached to the display. The base may be a fixed base wherein the display is at predetermined height relative to the base. The base may also be at a fixed tilt wherein the distance from the user to the top and bottom of a display cannot be adjusted. The base may also be an adjustable base wherein the height of the display can be changed relative to the base. A base may also allow the display to be tilted so that the top of the display is closer or further from the user than the bottom of a display. The base may have a foot and a riser that is attached to the foot. The riser can attach to the display and the foot can rest on a work surface. The foot can prevent the display from falling forward towards a user or backward away from a user.

BRIEF DESCRIPTION OF THE DRAWINGS

Some embodiments of the invention are described with respect to the following figures.

DETAILED DESCRIPTION

Figure 1A:
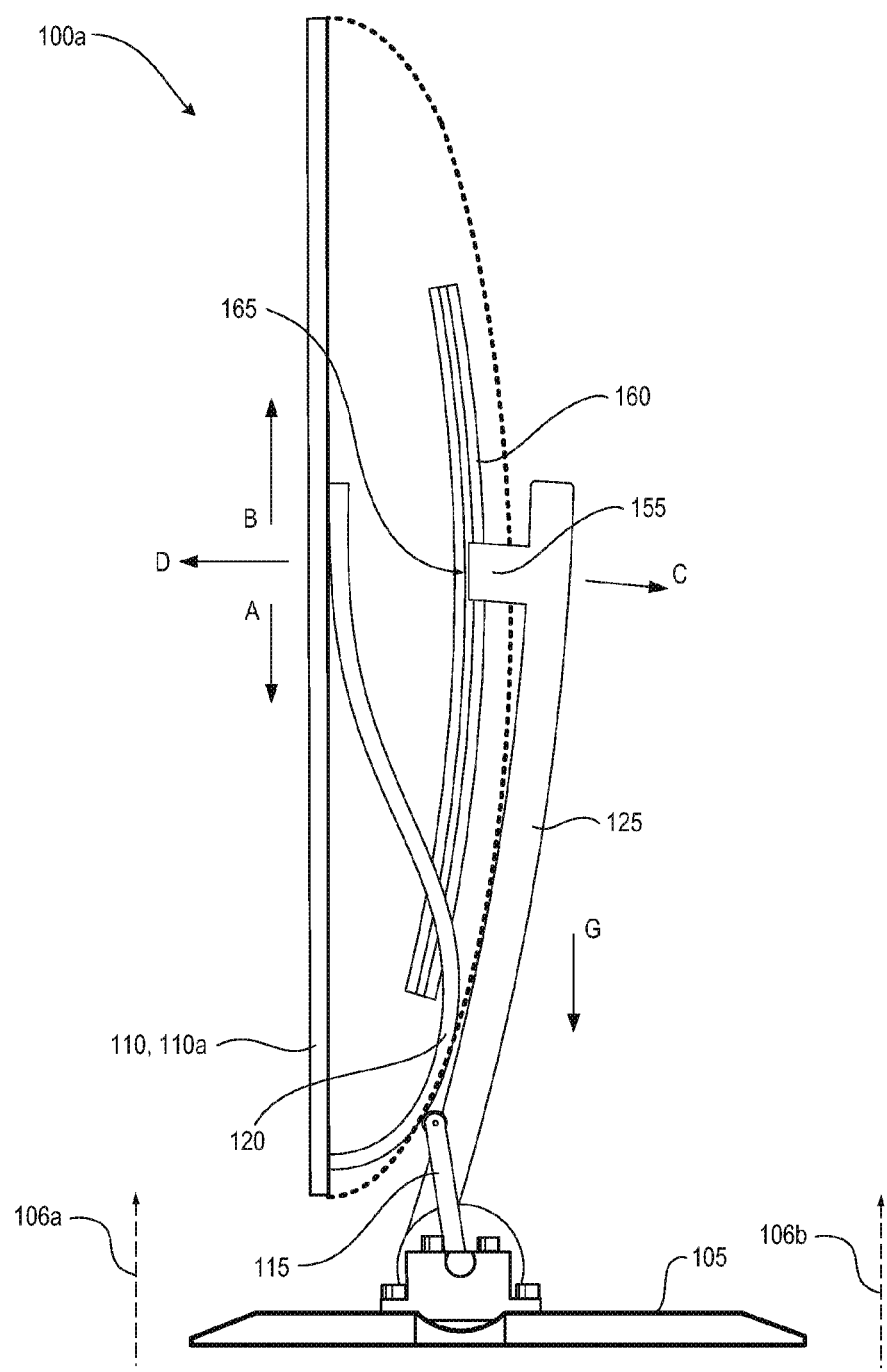
FIG. 1a is a side view of a system according to an example embodiment of the invention in a first orientation.

A device such as a display can be attached to a base. A base may include a foot and a riser from the foot. The base is a support for the chassis to oppose the force of gravity on the chassis. The base can be placed on a work surface such as a desk or a table for example. The chassis can be a display or can be a mounting point for a device such as a display.

Different software applications may be more efficiently used if the display could be in a vertical, a horizontal, or an orientation between vertical and horizontal. The vertical orientation is where the surface of the display is parallel to the force of gravity and the horizontal orientation is where the surface of the display is perpendicular to the force of gravity. To keep the chassis from causing the system from becoming unstable and fall over when the chassis is tilted the base is mounted as close to the center of gravity as possible or a chassis range of tilt is limited to a range that the chassis is still supported by the base. If a base is connected to the chassis near the center of gravity of the chassis and the chassis is tilted from a vertical position to a horizontal position then the display may be too high to be useable. For example if the base was attached to a chassis at a point 25 centimeters from a work surface and the chassis was tilted until it reached a horizontal position the surface of the chassis would be 25 centimeters from the work surface.

To make the device usable in a horizontal orientation the distance from the work surface the base is on to the chassis can be reduced is in a horizontal orientation. In one embodiment the base includes a foot and a riser. The riser can be an extension from the foot and the angle between the foot and the riser can be adjusted. The riser can include a fastener to connect the base to the chassis. The height of the chassis may be determined be the height of the fastener from the foot can which may be changed by tilting the riser relative to the foot so that the fastener becomes closer to foot as the angle between the foot and the riser approaches 0 degrees. If the chassis includes a display the top of the display may be moved away from the user when the riser is tilted closer to the foot. If the riser is tilted away from the user then the variable mounting point on the chassis can allow the chassis to move toward the user without moving the base toward the user. If the riser is tilted and the variable mounting point is adjusted the bottom of the chassis may be closer to the use than if the chassis was in a vertical orientation.

Using a variable mounting point on the chassis supporting the device causes the center of gravity of the chassis to move relative to the base causing a change in the weight distribution of the chassis. The variable mounting point can cause the center of gravity of the chassis to move beyond a threshold and cause the system to fall over when the force of gravity cannot be opposed by the base. Not having to increase the size of the base to be able to support the chassis in all the orientations that the center of gravity of the chassis is capable of being put in is advantageous by saving materials, saving shipping costs by smaller and lighter packaging and workspace area by smaller foot. The variable mounting point can allow the chassis to be put in many different orientations including orientations where the size and weight of the base are not able to oppose the force of gravity on the chassis. A curved track and an extension may not allow the chassis to go into an orientation that the chassis may be otherwise able to achieve because of the variable mounting point. The base size and weight can be determined so that the base can oppose the force of gravity on the chassis in the orientations that the chassis can achieve with the curved track and extension.

In one embodiment, a system includes a chassis and a curved track connected to the chassis. A base can be connected to the chassis and an extension can be connected to the base. The extension can be in contact with the curved track.

With reference to the figures, FIG. 1a is a side view of a system according to an example embodiment of the invention in a first orientation. A system 100a can include a chassis 110 in a first orientation 110a. The first orientation 110a may be a vertical orientation for example. The chassis 110 may be a display or a mounting point for a display. If the chassis is a mounting point for a device the chassis may be configured with a standard pattern for connecting a display to a base such as a Video Electronics Standards Association (VESA) mounting bracket. For example the VESA standard may have four openings in a 4 inch square pattern for fasteners such as a screw to attach the VESA mount to the display. A base may allow the orientation of the chassis to be adjusted for the user's application. The adjustments can allow the chassis attached to the base to be tilted, raised, lowered, or rotated for example.

A curved track 120 can be connected to the chassis 110. A base can include a first extension 115 in contact with the curved track 120. The base can include a foot 105 and a riser 125. The curved track may be one piece with the chassis or may be a separate part attached to the chassis. The curved track may extend perpendicular to the chassis from the chassis toward a surface of the curved track that contacts the extension. The distance between the surface of the curved track that contacts the extension and the chassis may change along the length of the track. For example a portion of the curved track may be 1 centimeter from the chassis and another portion of the curved track may be 5 centimeters from the chassis. The extension may be a piece of the base that extends from the base to contact the curved track and apply a force to the curved track.

The chassis 110 has a center of gravity and the chassis 110 can be reoriented relative to the base. The riser 125 can be attached to a variable mounting point 160 on the chassis 110. The variable mounting point 160 can allow the chassis to move in the A direction and the B direction without moving the riser 125 in the A direction or the B direction. The variable mounting point 160 is attached to the riser 125 with a fastener 155. In the first orientation 110a the fastener can be at a first location 165 on the variable mounting point 160. The variable mounting point can be for example a track or a rail and the fastener may slide along the track or rail if the chassis 110 is moved in the A or B direction.

The riser 125 can also be moved in the C direction and the D direction. If the chassis 110 is in the first orientation 110a then the center of gravity over the foot 105 of the base may not change enough when the chassis 110 is moved in the A direction or the B direction to move the center of gravity of the chassis beyond a threshold where the base is no longer able to provide an opposing force to the force of gravity G and the force of gravity causes the system to fall over when the center of gravity is moved toward or away from a user without moving the base for example.

Figure 1B:
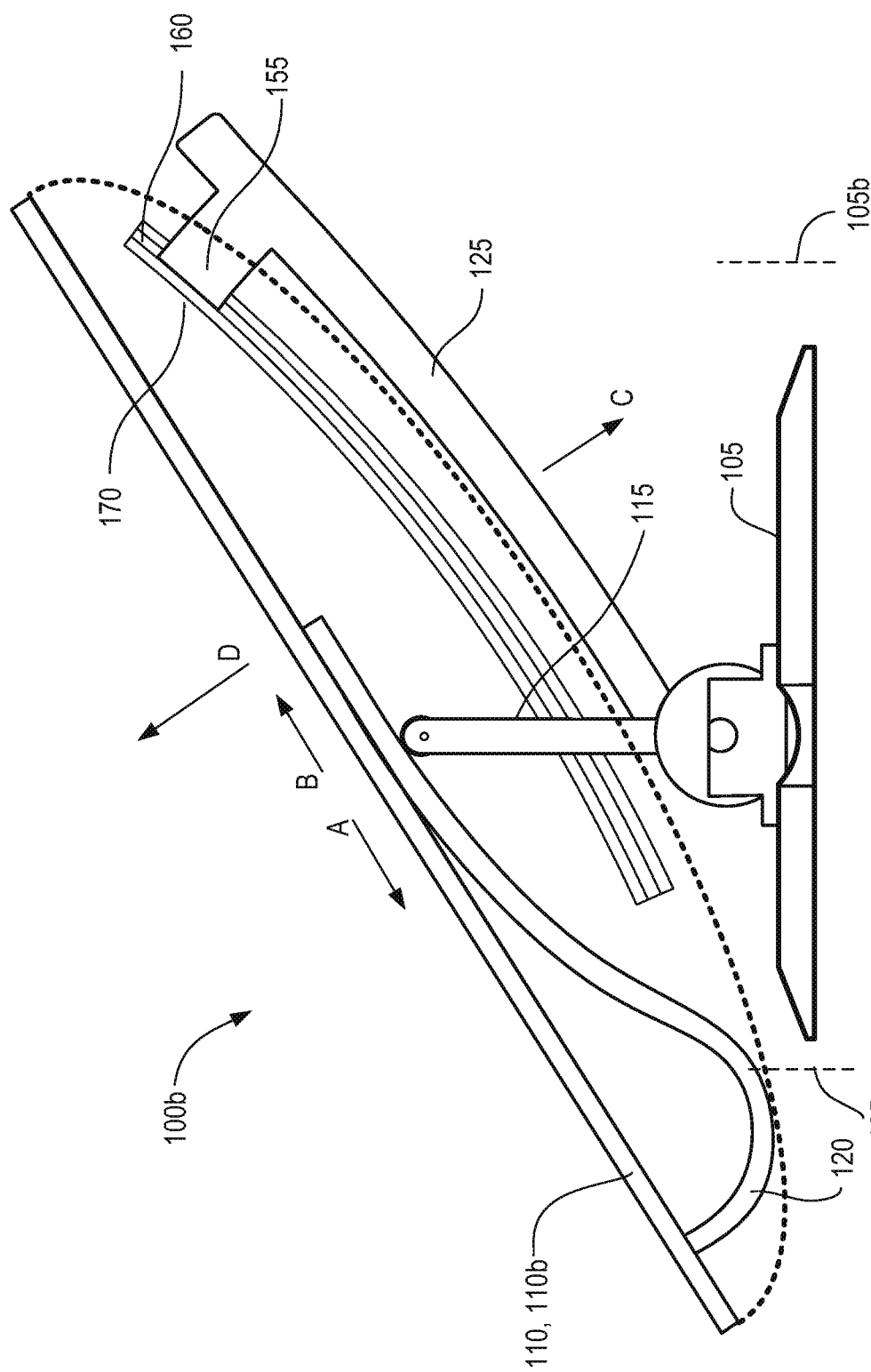
FIG. 1b is a side view of a system according to an example embodiment of the invention in a second orientation.

FIG. 1b is a side view of a system according to an example embodiment of the invention in a second orientation. The system 100b can include a chassis 110 in a second orientation 110b. The second orientation may be a horizontal orientation for example. In the second orientation 110b the first extension 115 is in contact with the curved track 120 at different location on the curved track 120 than the first extension 115 contacted the curved track 120 in the first orientation 110a. In the second orientation the fastener 155 is in at a second location 170 on the variable mounting point 160.

If the chassis is reoriented relative to the base from the first orientation 110a to the second orientation 110b the first extension 115 is moved along the curved track and can remain in contact with the curved track while the display is reoriented between the first orientation 110a and the second orientation 110b.

The curve of the curved track 120 and the force applied by the first extension 115 to the curved track 120 may prevent the center of gravity of the chassis 110 from being oriented to make the system fall over. For example the first extension may prevent the riser 125 and the chassis 110 from moving in the C direction until the chassis 110 has first moved in the A direction. If the riser 125 and the chassis 110 could move in the C direction without moving the chassis 110 in the A direction the center of gravity of the chassis could extend beyond a threshold. The threshold can be for example 105a and 105b and if the center of gravity of the chassis passes either of these thresholds the system 100 falls over. The threshold is variable and is determined by the weight of the chassis 110, the weight of the riser 125 and the weight of the foot 105, the length of the foot along with other variables. Reducing the movement of the center of gravity of the chassis may allow the threshold to be reduced. Reducing the threshold can allow the base to be lighter, shorter or both while still supporting the chassis in all the orientations that the chassis is can be oriented into and the prevent the force of gravity from causing the system to fall over.

Figure 2:
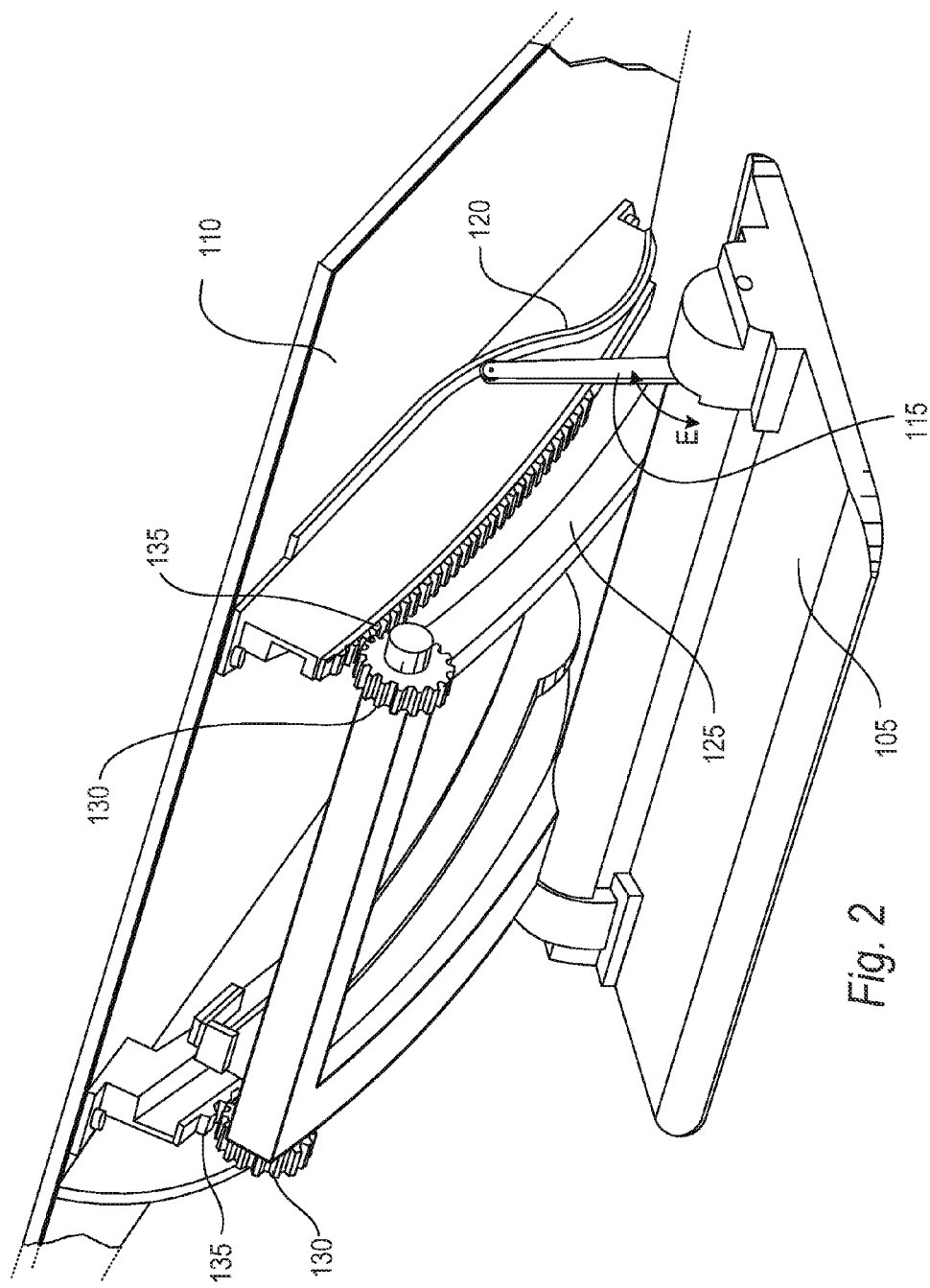
FIG. 2 is a perspective view of a system according to an example embodiment of the invention.

FIG. 2 is a perspective view of a system according to an example embodiment of the invention. In one embodiment the first extension 115 is at a fixed angle to the foot 105. In another embodiment the extension is at a variable angle to the base and can move E direction. The movement in the E direction of the first extension 115 can allow some adjustability of the chassis such as tilting forward or backward at an orientation. For example if the chassis 110 is in the first orientation 110a then the chassis may be able to tilt forward where the top of the chassis 110 is closer to a user than the bottom of the chassis 110 or tilt backward where the bottom of the chassis 110 is closer to a user than the top of the chassis 110. If the first extension 115 was in a fixed position the first extension 115 and the curved track 120 may prevent the system from tilting forward or backward.

In one embodiment the riser 125 may include a gear 130 to follow a path 135. If two gears are used and the gears are connected so as to turn at the same speed it may reduce the chance that the chassis enters a skewed position where one side of the chassis is closer to the foot of the base than the other side of the chassis and cannot be reoriented relative to the riser 125.

Figure 3:
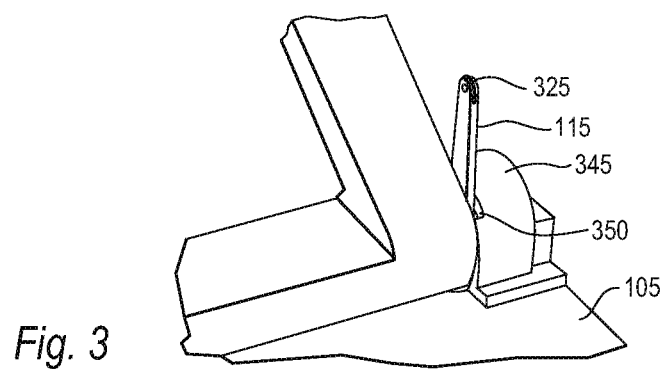
FIG. 3 is a partial view of a system according to an example embodiment of the invention.

FIG. 3 is a partial view of a system according to an example embodiment of the invention. The system can include a first extension 115 attached to the foot 105 of a base with a biasing mechanism 345. The biasing mechanism 345 can be attached to the foot 105 of the base and connect to one end of the first extension 115. The biasing mechanism 345 may include a spring, for example a torsion spring or another type of spring. The biasing mechanism 345 may apply a force to the first extension 115 as the first extension 115 is tilted with respect to the foot 105. The bias applied to the first extension 115 can allow the first extension 115 to remain in constant contact with the curved track attached to the chassis 110 when the chassis 110 is tilted forward or backward. The tilting of the chassis 110 can be limited by the amount of travel that is allowed by the first extension 105. For example if the amount of travel of the extension is limited by the length of a slot 350 then the tilting of the chassis 110 may be limited be the length of the slot 350.

In one embodiment the first extension 115 may include a wheel 325. The wheel 325 may be in contact with the curved track 120 attached to the chassis. The wheel 325 may reduce the amount of friction between the first extension 105 and the curved track. In other embodiments other attachments may be applied to the first extension 105 to reduce the friction between the first extension 105 and the curved track such a polytetrafluoroethylene coating.

Figure 4:
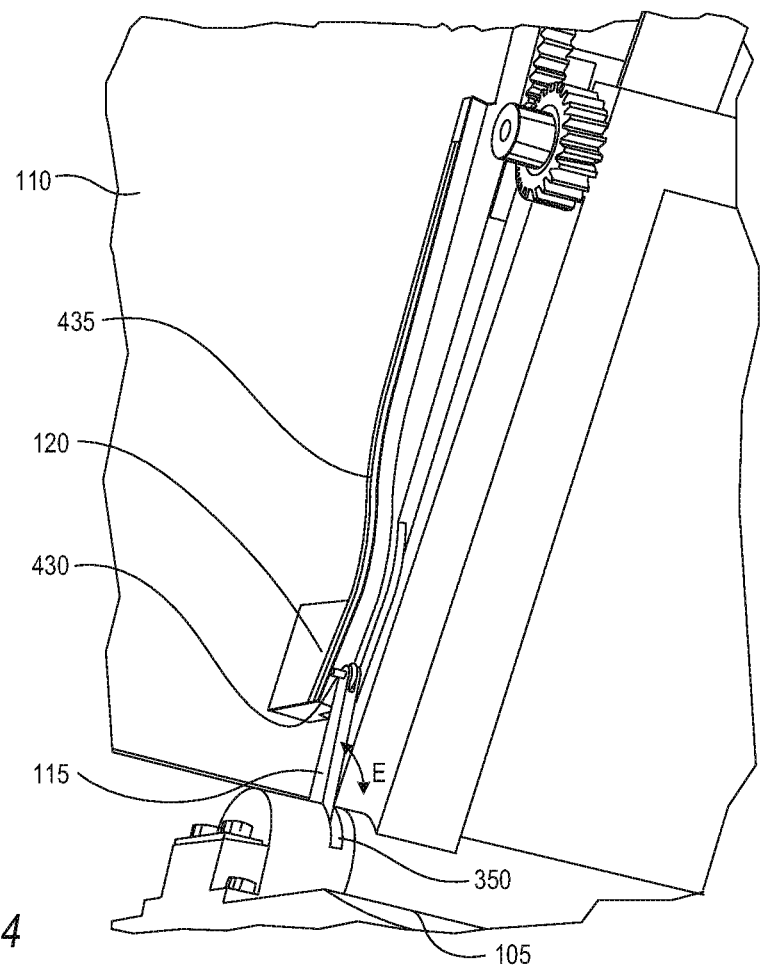
FIG. 4 is a partial view of a system according to an example embodiment of the invention.

FIG. 4 is a partial view of a system according to an example embodiment of the invention. The system can include a curved track 120 with a slot 435 along the curved track 120. The slot 435 can be on different surfaces of the curved track 120 depending on the type of coupler 430 attached to the slot 435. For example if the coupler 430 is on the side of the first extension 115 then the slot 435 may be on the same side of the curved track 120. In one embodiment, coupling the first extension 115 to the curved track 120 can be used in place of the biasing mechanism or may be used at the same time as the biasing mechanism to keep the first extension 115 in contact with the curved track 120 if the chassis 110 is tilted forward or backward.

If the first extension 115 is coupled by the coupler 430 to the curved track 120 both the forward and backward tilt of the chassis can be limited by the length of the slot 350. The slot 350 may allow the first extension 115 to have a range of motion in the E direction for example through an arc of about 15 degrees. The coupler 430 can prevent the chassis from tilting more than what is allowed by the movement of the first extension 115 in the slot 350 if the chassis and the first extension 115 are attached by the coupler 430. The amount of tilt of the chassis 120 allowed by the first extension 115 relative to the foot 105 of the base may be different as the first extension 115 is coupled to different portion of the curved track as the chassis 110 is reoriented relative to the base.

Figure 5:
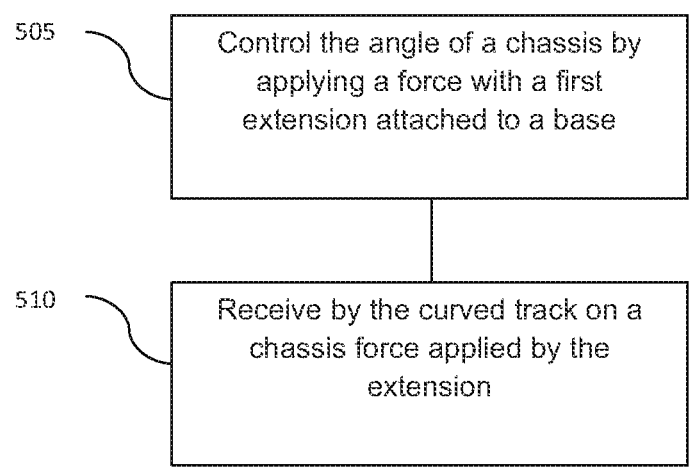
FIG. 5 is a flow diagram according to an example method of the invention to control the angle of a chassis.

FIG. 5 is a flow diagram according to an example method of the invention to control the angle of a chassis. The method includes controlling the angle of a chassis by applying a force with a first extension attached to a base at 505. The chassis can include a curved track in contact with the first extension. The force applied by the extension is received by the curved track on a chassis at 510.

The curved track can prevent the chassis from moving to an orientation relative to the base that causes the center of gravity of the chassis to be beyond a threshold where the base can support the chassis without becoming unstable and fall over. The system could fall forward or backward depending on if the center of gravity of the chassis is moved forward past a threshold or moved backward past a threshold and therefore the curved track and the extension prevent the chassis from moving past the thresholds.

To allow the chassis to be tilted forward or backward the first extension can be moved to multiple angles to the base. In one embodiment the first extension 115 may be biased against the curved track 120 so that the first extension is in contact with the curved track at different orientations of the chassis.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A system comprising:
   a chassis including a variable mounting point;
   a curved track separate from the variable mounting point and connected to the chassis;
   a base including a foot and a riser that moves relative to the foot, wherein the riser is movably attached to the variable mounting point of the chassis, the riser being movable along the variable mounting point to reorient the chassis with respect to the base from a first orientation to a second orientation; and
   an extension separate from the riser and connected to the base and in contact with the curved track, wherein the extension is movable along the curved track to reorient the chassis from the first orientation to the second orientation.

2. The system of claim 1, wherein the extension is slidable along the curved track as the chassis is reoriented from the first orientation to the second orientation.

3. The system of claim 1, wherein the extension is at a fixed angle to the foot.

4. The system of claim 1, wherein the extension is at a variable angle to the foot.

5. The system of claim 4, further comprising a mechanism to bias the extension against the curved track.

6. The system of claim 1, further comprising a coupler to keep the extension in contact with the curved track.

7. The system of claim 1, wherein the extension further comprises a wheel to contact the curved track, the wheel rolling along the curved track as the chassis is reoriented from the first orientation to the second orientation.

8. The system of claim 1, wherein the curved track prevents an orientation of the chassis relative to the base wherein a center of gravity of the chassis is beyond a threshold.

9. A method of forming an apparatus that controls an orientation of a chassis, comprising:
   supporting the chassis with a base including a foot and a riser, the riser including a fastener movably attached to a variable mounting track of the chassis, the fastener being slidable along the variable mounting track to reorient the chassis with respect to the base from a first orientation to a second orientation; and
   attaching an extension separate from the riser to the base, the extension movable along a curved track that is separate from the variable mounting track to reorient the chassis from the first orientation to the second orientation.

10. The system of claim 9, further comprising biasing the extension against the curved track.

11. The system of claim 8, wherein the threshold is a point corresponding to an orientation of the chassis at which the base cannot oppose gravity on the chassis.

12. The system of claim 1, wherein the curved track has a first portion that curves outwardly away from the chassis, and a second portion that curves inwardly towards the chassis.

13. The system of claim 1, wherein the curved track is generally S-shaped.

14. The system of claim 1, wherein the variable mounting point includes a track along which the riser is slidable, and wherein a first path of motion of the riser relative to the variable mounting point has a first shape, and wherein a second path of motion of the extension relative to the curved track has a second shape different from the first shape.

15. The method of claim 9, wherein the variable mounting track has a shape different from a shape of the curved track.

16. The method of claim 9, wherein a first path of motion of the riser relative to the variable mounting track has a first shape, and wherein a second path of motion of the extension relative to the curved track has a second shape different from the first shape.

17. The method of claim 9, wherein the curved track is generally S-shaped.

18. The method of claim 9, wherein the curved track has a first portion that curves outwardly away from the chassis, and a second portion that curves inwardly towards the chassis.

19. An apparatus comprising:
   a base including a foot, a riser, and an extension separate from the riser,
   the riser including a fastener slidable along a variable mounting track of a chassis for support by the base, the fastener being slidable along the variable mounting track to reorient the chassis relative to the base from a first orientation to a second orientation, and
   the extension movable along a curved track that is separate from the variable mounting track to reorient the chassis relative to the base from the first orientation to the second orientation,
   wherein a first path of motion of the riser relative to the variable mounting track has a first shape, and wherein a second path of motion of the extension relative to the curved track has a second shape different from the first shape.

* * * * *